United States Patent
Flores et al.

(10) Patent No.: US 8,547,164 B2
(45) Date of Patent: Oct. 1, 2013

(54) CLOSED LOOP ADAPTIVE VOLTAGE SCALING

(75) Inventors: Jose Luis Flores, Richardson, TX (US); Anthony M. Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 13/218,131

(22) Filed: Aug. 25, 2011

(65) Prior Publication Data
US 2012/0075005 A1 Mar. 29, 2012

Related U.S. Application Data (60) Provisional application No. 61/387,283, filed on Sep. 28, 2010.

(51) Int. Cl.
*H01L 35/00* (2006.01)

(52) U.S. Cl.
USPC .......................................................... 327/513

(58) Field of Classification Search
USPC ................. 327/512, 513, 534, 535, 538, 540, 327/541, 543
See application file for complete search history.

(56) References Cited

U.S. PATENT DOCUMENTS

| | | | |
|---|---|---|---|
| 6,868,503 B1 | 3/2005 | Maksimovic et al. | |
| 7,149,645 B2 * | 12/2006 | Mangrulkar et al. | 702/130 |
| 7,657,772 B2 * | 2/2010 | Clabes et al. | 713/500 |
| 7,887,235 B2 * | 2/2011 | Campos et al. | 374/178 |
| 2008/0120065 A1 | 5/2008 | Joshi et al. | |

OTHER PUBLICATIONS

"TMS320C6678 Multicore Fixed and Floating-Point Digital Signal Processor", Data Manual, SPRS691, Texas Instruments Incorporated, Nov. 2010, pp. 1-259.

* cited by examiner

*Primary Examiner* — Jeffrey Zweizig
(74) *Attorney, Agent, or Firm* — Robert D. Marshall, Jr.; Wade James Brady, III; Frederick J. Telecky, Jr.

(57) ABSTRACT

An integrated circuit is provided with a set of sensors for scaling voltage based on performance of the integrated circuit. The set of sensors are monitored, and sensor provides an output value indicative of a performance metric of the integrated circuit. The output values from the set of sensors are combined using a calibrated model to determine when a threshold value is reached. A change to an operating voltage for a portion of the integrated circuit is initiated in response to reaching the threshold.

13 Claims, 6 Drawing Sheets

CLOSED LOOP ADAPTIVE VOLTAGE SCALING

CLAIM OF PRIORITY UNDER 35 U.S.C. 119(e)

The present application claims priority to and incorporates by reference U.S. Provisional Application No. 61/387,283, filed Sep. 28, 2010, entitled "Cache Controller Architecture."

FIELD OF THE INVENTION

This invention generally relates to management of power in a system on a chip, and more particularly to maintaining calibration of a device on the chip or coupled to the chip when voltage levels are changed.

BACKGROUND OF THE INVENTION

System on Chip (SoC) is a concept that strives to integrate more and more functionality into a given device. This integration can take the form of either hardware or solution software. Performance gains are traditionally achieved by increased clock rates and more advanced processor nodes. Many SoC designs pair a digital signal processor (DSP) with a reduced instruction set computing (RISC) processor to target specific applications. A more recent approach to increasing performance has been to create multi-core devices. In these scenarios, management of power dissipation on the chip may be done to conserve power.

BRIEF DESCRIPTION OF THE DRAWINGS

Particular embodiments in accordance with the invention will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

High performance computing has taken on even greater importance with the advent of the Internet and cloud computing. To ensure the responsiveness of networks, online processing nodes and storage systems must have extremely robust processing capabilities and exceedingly fast data-throughput rates. Robotics, medical imaging systems, visual inspection systems, electronic test equipment, and high-performance wireless and communication systems, for example, must be able to process an extremely large volume of data with a high degree of precision. A multi-core architecture that embodies an aspect of the present invention will be described herein. In a typically embodiment, a multi-core system is implemented as a single system on chip (SoC). As used herein, the term "core" refers to a processing module that may contain an instruction processor, such as a digital signal processor (DSP) or other type of microprocessor, along with one or more levels of cache that are tightly coupled to the processor.

An embodiment of the invention may use multiple, heterogeneous sensors to dynamically determine how well an integrated circuit is performing. By dynamically sensing performance metric information from the sensors, an operating voltage of the integrated circuit may be adjusted to minimize power consumption while maintaining a target performance level across a range of process, temperature and performance requirements. The use of a set of heterogeneous sensors may provide better tracking of performance metrics than use of a single sensor.

In some embodiments, a portion of the sensors may be configured to over-compensate their performance metric in response to process, temperature and voltage variations. Another portion of the sensors may be configured to under-compensate their performance metric in response to process, temperature and voltage variations. The output data from each sensor may be combined using an adaptive complex equation to better track the actual operation of the integrated circuit.

By utilizing multiple sensors to determine a performance metric for the integrated circuit based on a complex equation, a less pessimistic value is determined as compared to merely using one sensor, or using a worst case value from a set of sensors.

A set of heterogeneous sensors may be used during manufacture of an SoC to grade, or bin out, each SoC based on operation of the multiple sensors when the SoC is tested. In order to do this, an equation or set of equations, is developed during initial design of the SoC. The equations may be used to combine the outputs of the set of sensors and then predict the operating performance of the SoC based entirely on the outputs of the set of sensors. This may be done initially using Spice simulations before the SoC is available, and then refined using a set of evaluation SoCs. Once the set of equations has been shown to reliably predict the performance capability of the SoC, then the output of the sensors may be used during a test phase in the manufacture of each SoC to predict the maximum operating frequency of each SoC. Each SoC may then be "branded" with this value and then sorted into different bins to indicate their performance capability. Each SoC may be branded by blowing a set of fuses within the SoC, for example, so that internal control logic within the SoC will be able to use the maximum operating frequency value as a target value of reference value during the normal course of operation of the SoC. Other embodiments may use an electrically programmable read only memory (EPROM) or other type of persistent storage device, to store the maximum operating frequency value within the SoC. A related US Patent Application Publication number 2008/0120065 entitled "Accurate Integrated Circuit Performance Prediction Using On-Board Sensors," which is incorporated by reference herein, describes aspects of using a set of sensors to predict SoC performance during manufacture of an SoC in more detail.

Figure 1:
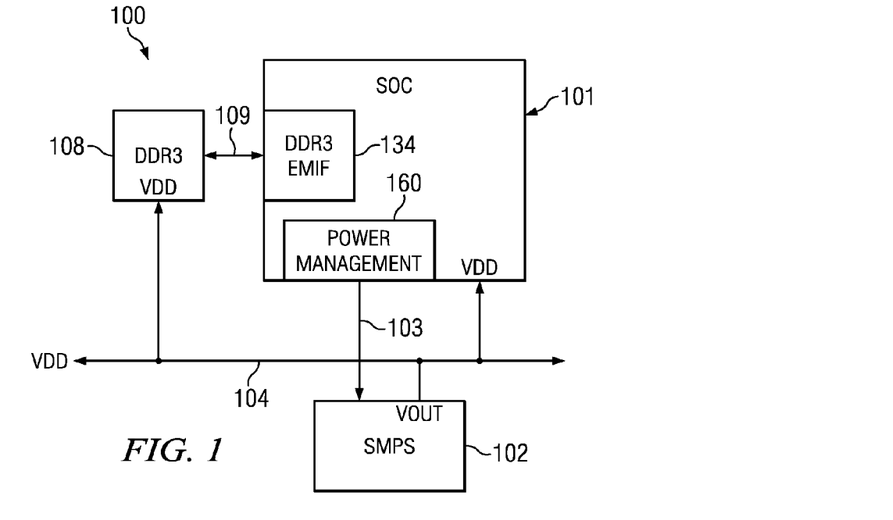
FIG. 1 is a block diagram of a system that includes an SoC with a variable power supply.

FIG. 1 is a block diagram of a system 100 that includes an SoC 101 with a switched mode variable power supply (SMPS) 102 and a dual data rate three (DDR3) memory subsystem 108. System 100 may be a video system that may include 4-6 gbyte of DDR3 memory, for example. Cloud computing systems require large amounts of processing power and may include a large number of systems similar to system 100. Consumer systems such as gaming systems may need to operate in variable ambient temperature situations, for example. System 100 may be part of a portable or mobile device that are typically battery powered and need to conserve power. These and other types of systems may benefit from embodiments of the present invention.

DDR3 memory 108 is controlled by a DDR3 controller that is included within external memory interface (EMIF) 134. Power management module 160 is on-chip SoC 101 and provides control signaling 103 to SMPS 102 to cause it to raise or lower the output voltage VDD provided on voltage output terminal VOUT. Supply voltage VDD is provided via voltage bus 104 to operate DDR3 108 and SoC 101. There may also by other devices and modules within system 100 coupled to voltage bus 104 that use variable supply voltage VDD provided by variable power supply 102. The general operation of DDR3 memory is well known and will not be described in detail herein. Likewise, the general operation of variable switched mode power supplies is well known and will not be described in detail herein. Other types of variable power supplies now known or later developed may also be used, such as a linear regulated supply, a programmable power supply, etc.

Figure 2:
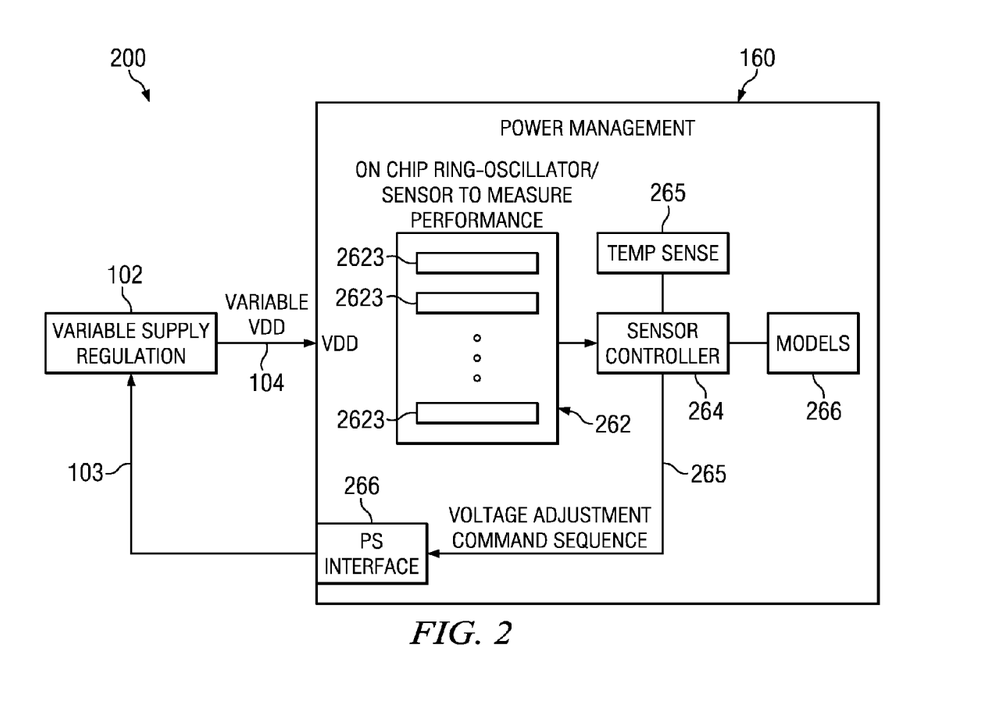
FIG. 2 is a more detailed block diagram of a power management module used in the SoC of FIG. 1.

FIG. 2 is a more detailed block diagram of power management module 160 used in SoC 100. Power management 160 includes a set of performance sensors 262 that dynamically measure the frequency response of SoC 101 to changes in temperature over time. As a semiconductor chip heats up due to power consumption, the mobility of the electrons in the semiconducting devices increases which cause the performance of the SoC to actually increase as temperature increases. Supply voltage can therefore be reduced when temperature rises while maintaining a desired performance value. Similarly, as the ambient temperature drops and the semiconductor cools down, mobility decreases and performance decreases. Therefore, as temperature drops, voltage may need to be raised to maintain the desired performance value. Each sensor 263 in set 262 is a free running oscillator whose frequency is therefore dependent on the temperature of a local region of chip substrate on which the sensor is formed. As SoC 101 executes different application programs, the various processing modules and memories will be exercised at different rates, which will cause the temperature of various areas of SoC 101 to rise and fall, based on power consumption due to activity of the various processing modules.

Sensor controller 264 monitors the various sensors 263 to determine the free running frequency at which they are operating in response to local temperature. As the SoC substrate heats up, the frequency of each sensor and the other functional modules of SoC 101 typically will increase, as explained above. Therefore, power consumption may be reduced by reducing the operating voltage which will then cause the chip performance and temperature to decrease. Sensor controller 264 attempts to control the supply voltage 104 provided by variable power supply 102 in order to maintain a minimum required operating frequency while optimizing power consumption. A voltage adjustment command sequence 265 is sent to interface 266 that is coupled to variable supply 102 via control signal 103. The format of control signal 103 may vary for different implementations and may be either a serial interface or a parallel interface, for example. The command sequence instructs variable supply 102 to either raise or lower supply voltage 104 by a small amount. Additional commands are sent to direct further increases or decreases, based on the performance information provided by a set of sensors 262. Typically, a high performance threshold and a low performance threshold are defined. The power management strives to maintain performance level of the SoC within the high and low thresholds. In some embodiments, the thresholds may be changed during operation of the system in response to ambient conditions, power overall power budgets, etc.

Referring again to the effect of heating on performance, SPICE simulations predict that as an integrated circuit heats up it operating frequency will increase. However, in reality there are portions of the temperature range where this is not true. For example, a temperature increase due to a combination of ambient plus internal self heating of the part across a large range such as −40 c, or 0 c to 105 c will indeed show that performance is higher at higher temperature. However, over a smaller portion of that range, such as between 30 c and 105 c, then the performance actually degrades with the higher temperature in some chips due to those chips being interconnect dominated and the interconnect having a bigger performance impact in that temperature window.

A solution to address this anomaly is to have a portion of the various sensors available that are sensitive to interconnect delay; while another portion of the various sensors will be sensitive to gate delay. In that manner, a complex equation model can be developed based on the critical path behavior by weighting the sensor terms in the equation to match the characterized actual performance of the integrated circuit.

As these supply voltage adjustments are made, care must be taken to ensure that performance critical interfaces such as DDR3 are able to operate through these changes in voltage. In this embodiment, DDR3 memory 108 operates on the same supply voltage 104 that is used by SoC 101 and will therefore be subject to the same changes in voltage. By operating on the same voltage, the need for signal level shifters is eliminated. However, the timing operation of DDR3 devices may be sensitive to supply voltage level. Therefore, DDR3 memory 108 may need to be recalibrated as the supply voltage is changed.

Power management 160 may perform other types of power management for SoC 101. For example, it may reduce or remove power from various modules that are not currently being used by an application program that is being executed by SoC 101. There may be additional temperature sensors that indicate if the chip temperature is getting too high. If chip temperature gets too high, voltage and/or clock frequency may need to be reduced to significantly reduce power consumption, fans may be instructed to start or speed up, etc.

Figure 3:
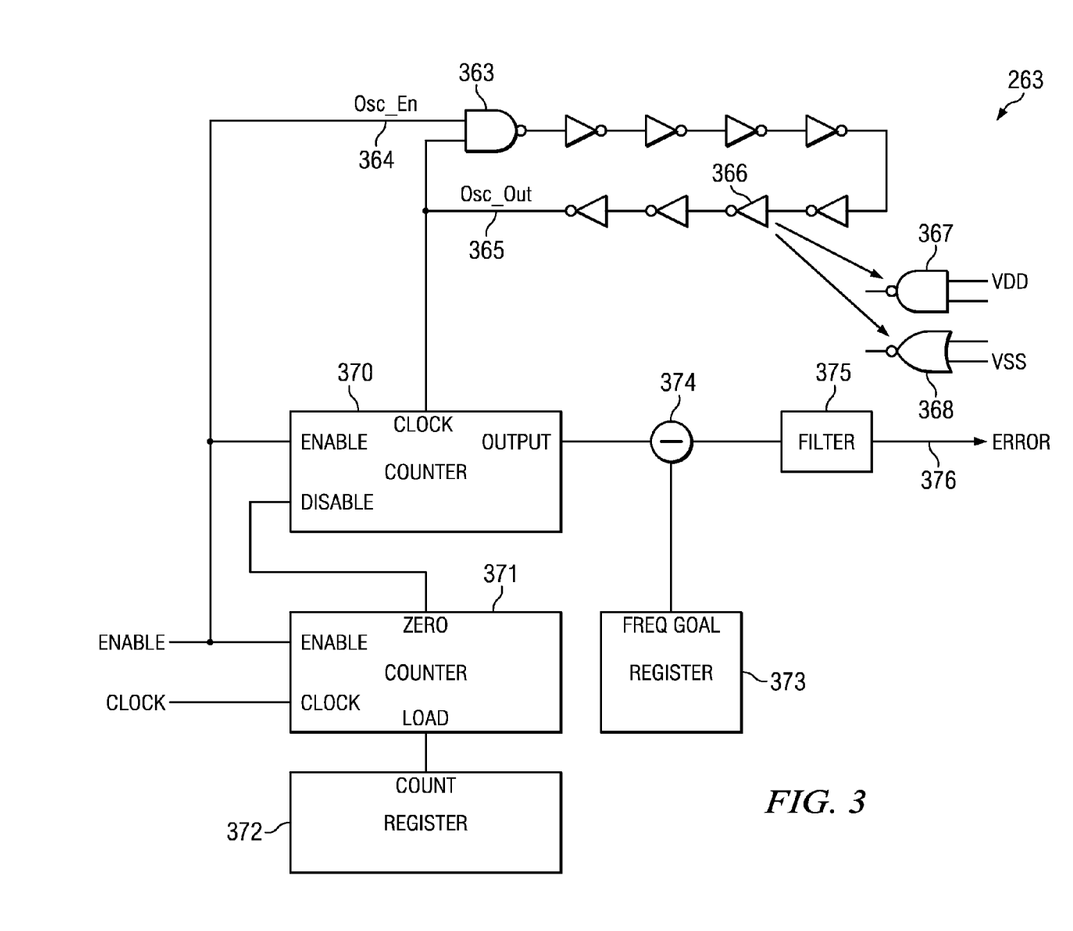
FIG. 3 illustrates a performance sensor used in the SoC of FIG. 1.

FIG. 3 illustrates the logic diagram of an exemplary performance sensor 263 that is part of the set of sensors 262 used in SoC 101. Each performance sensor 362 is a ring oscillator (RO). The set of sensors 262 is chosen to capture a range of performance variations within SoC 101. These ROs are chosen to predict performance of the full range of gates on the chip. The ROs chosen employ a range of cells including NANDs, NORs and inverters that utilize transistors having two possible voltage threshold values standard voltage threshold (SVT) and high voltage threshold (HVT). Silicon chip manufacture produces built-in random variations in the performance of transistors. These variations affect different types of logic cells in varying degrees. These cells do not have to exhibit worse case performance among all logical gates. Their performance need only be predictive of some of the random variations observed in the critical paths of the chip.

As discussed above, the set of sensors may include various types of sensors that are sensitive to different operating parameters such as: voltage threshold, gate style, interconnect propagation delay, etc. Other types of sensors besides ring oscillators either now known or later developed may by used in various embodiments of the invention.

Each ring oscillator may be made up of only one gate type for all nine stages with one exception. An all-inverter ring oscillator includes a 2-input NAND 363 to input an enable signal Osc_En 364. The individual stages 366 may be 2-input NAND gates 367 or 2-input NOR gates 368, for example. Table 1 includes a non-exhaustive list of oscillator elements stages that may be used in combinations and permutations of gate types and gate parameters found to strongly influence model accuracy. Other embodiments may use more or fewer than nine stages which will cause a corresponding change in the free running frequency.

TABLE 1

| Ring Oscillator gate parameters | | |
| Ring Oscillator gate parameters | | |
| --- | --- | --- |
| Inverter | NAND2 | NOR2 |
| Standard VT (SVT) | Standard VT (SVT) | Standard VT (SVT) |
| High VT (HVT) | High VT (HVT) | High VT (HVT) |
| Size A | Size A | Size A |
| Size B | Size B | Size B |

During design of the SoC, the respective operating frequencies of these ROs are measured, either by simulation or by inspection. The corresponding periods of the oscillators may be converted to equivalent gate delays values $D(RO_i)$. The resulting gate delay values are combined using a linearly fitted model to predict the delay of critical paths in the chip. The linearly fitted models are constructed during characterization after the chip is manufactured. The delay D(CP) of the worst of several critical paths is also determined either by simulation or by characterization of the chip. This may be done as part of process to perform testing during manufacture of the SoC, as discussed above with regard to US Patent application publication number 2008/0120065.

Performance sensor 263 includes a counter 370 that counts the number of oscillations on osc-out signal 365 over a period of time defined by counter 371 that is driven by a clock signal from SoC 101. A reloadable count value is stored in a memory mapped register 372 that may be initiated by SoC 101 system software or other application software. In some embodiments, register 372 may be a read only device that is programmed at time of manufacture or may be a writable memory device that is programmed when SoC 101 is initialized for operation, for example.

Register 373 stores a frequency goal value that may be initiated by SoC 101 system software or other application software. In some embodiments, register 373 may be a read only device that is programmed at time of manufacture or may be a writable memory device that is programmed when SoC 101 is initialized for operation, for example. Determination of the frequency goal value will be described in more detail below.

Subtracter 374 compares the frequency count from counter 370 and the frequency goal value from register 373 and generates an error signal that is filtered by filter 376 to reduce transient values in error signal 376. Referring again to FIG. 2, an output error signal 376 from each sensor 263 of the set of sensors 262 is then provided to sensor controller 264.

During characterization, the delay values for a suitably large number of ROs of several types from many individual die (chips) are measured and computed. Equation (1) shows how this information can then be fitted to a linear model.

$$D(CP) = \sum_i a_i D(RO_i) \qquad (1)$$

where: D(CP) is the delay of the worst of the critical paths in the SoC; $a_i$ is a linear scaling coefficient of the i-th RO; and $D(RO_i)$ is the delay value of the i-th RO. The linear scaling coefficient $a_i$ may be viewed as weighting factors affecting the contribution of an individual RO delay value to the expected worst case path delay D(CP).

Equation (2) shows a second-order linear model which may also be used to obtain better accuracy:

$$D(CP) = \sum_i a_i D(RO_i) + \sum_i \sum_j (b_{i,j} D(RO_i) D(RO_j)) \qquad (2)$$

where: $b_{i,j}$ is a linear scaling coefficient similar to $a_i$ of the i-th and the j-th RO. Both the first order model and the second order model take into account the variations in the ROs to determine the extent to which they affect the critical path. Generally any path on a chip uses structures similar to those used in the ROs. By replicating these structures in the ROs, it is possible to capture their variation. The delay value contributions of each of these structures to the total path delay yield different scaling coefficients ($a_i$ and $b_{i,j}$).

In another embodiment, rather than converting to equivalent gate delays, a correlation to critical path delays may be made by weighting the contribution of each oscillator using a frequency measure, for example, in the complex first or second order polynomial equations.

Figure 4:
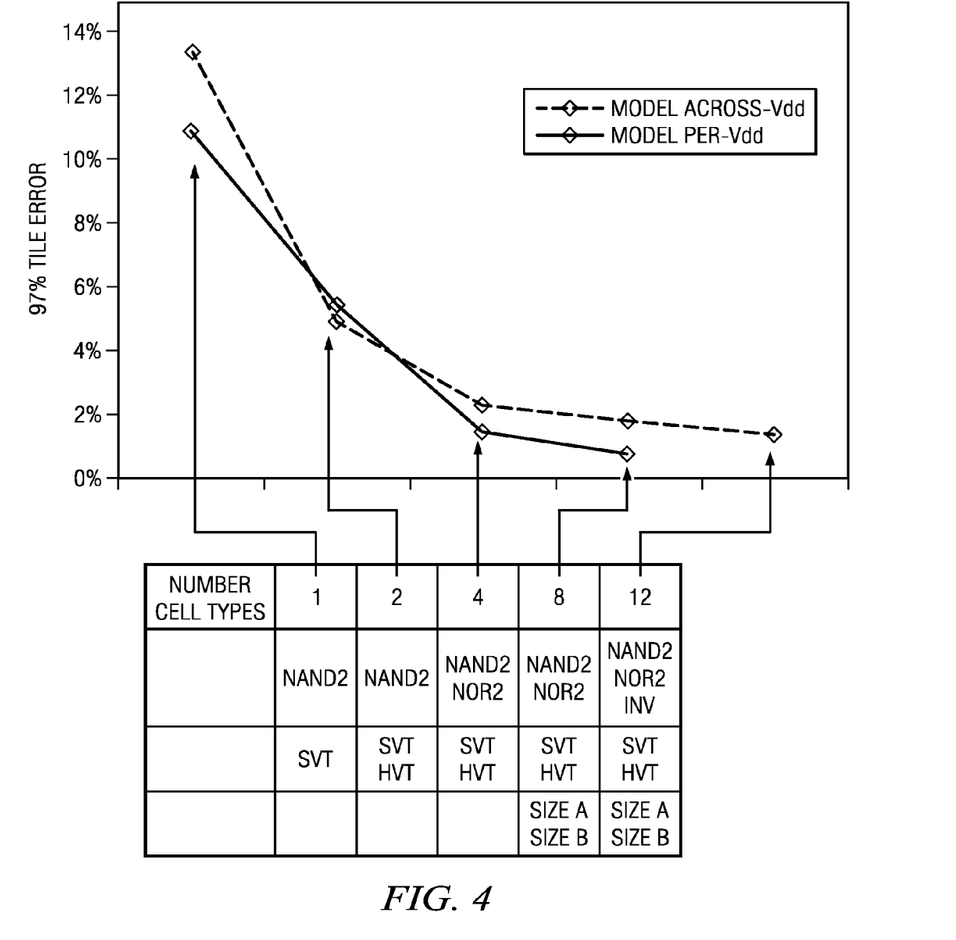
FIG. 4 is a plot illustrating prediction accuracy versus sensor combinations.

FIG. 4 illustrates curves of accuracy of prediction for ninety seventh percentile error for critical path delay D(CP) for increasingly complex combinations of RO cells included in the linear regression. The vertical axis is the ninety-seventh percentile worst error in predicting performance of several critical paths using the delay values of several different ring oscillator combinations. The horizontal axis indicates the types of different ROs used. The extreme left point includes only one RO type. Moving along the X axis includes increasing combinations of ROs and permutations of parameters. As shown in FIG. 4 these additional inputs provide improving predictability.

The model equations may include parameters that could extend beyond ring oscillators. For example, they may include:
Transistor and interconnect parameters measurements;
Voltage, temperature and other environmental parameters. For example different critical paths may be important at different voltages;

Processing equipment used during manufacturing or testing. Different lithography tools may exhibit different correlations between the ROs and the critical path; and Current application being run on the chip. Some applications may only exercise only a few of the critical paths on the chip or may cause a smaller IR drop or temperature. This may result is a different maximum performance capability by the chip based upon the current application.

Model construction can be piece-wise using a different model for each value or range of values of particular parameter. A higher order model than equations (1) and (2) may be used.

Coefficient Fitting

Figure 5:
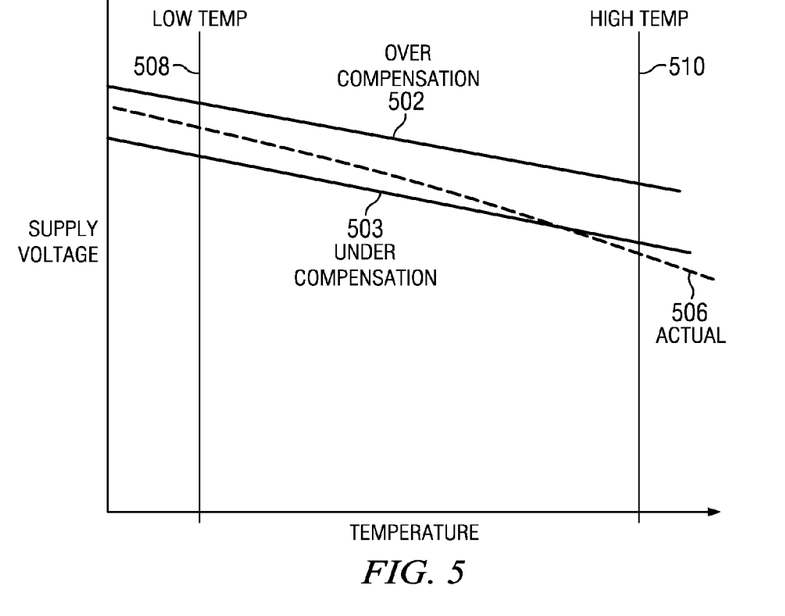
FIG. 5 is a plot illustrating results from different sensors over a range of temperature.

During characterization of the chip, a least squares fit is performed using RO delays as the fitting functions to the critical path delay to form terms for linear regression. The fitting can be done to either first or second order polynomials such as equations (1) or (2) of the RO delays depending on which method fits the critical path delays with minimum errors. A set of fittings for different voltages and temperatures (V/T) may be performed for RO frequencies to $F_{max}$ over a range of voltages and temperatures using linear regression. Each fitted expression might differ due to variation in operation of an integrated circuit at different temperatures and voltages FIG. 5 is a plot illustrating results from different sensors over a range of temperature for a target performance level. In this illustration, output from two sensors 502, 503 is illustrated for clarity; however, typically a larger number of sensors will be used. Plot 506 illustrates what supply voltage is actually required to maintain the target chip performance over the range of temperature. In this example, sensor output 502 is over-compensating in that it is predicting a higher voltage is needed, while sensor 503 is under-compensating. By forming a set of V/T models, accuracy of the models can be improved. For example, there may be one model developed to predict chip performance at a lower temperature 508, and a second model developed to predict chip performance at a higher temperature 510.

Referring again to FIG. 2, sensor controller 264 receives an output error signal 376 from each sensor 263 of the set of sensors 262. Sensor controller 264 weights each error signal based on the weighting coefficients such as $a_i$ and $b_{i,j}$ in the performance prediction model equation, as discussed above. If the resulting total error signal is within a defined range, then the supply voltage is left alone. If the resulting total error signal predicts the SoC is performing above the target performance metric, then a control sequence is sent to variable supply 102 to reduce the supply voltage. Similarly, if the resulting total error signal predicts the SoC is performing below the target performance metric, then a control sequence is sent to variable supply 102 to raise the supply voltage.

Sensor controller 264 may also receive an indication of local chip substrate temperature from a temperature sensor 265. Based on the actual chip temperature, sensor controller may select a performance prediction model from model storage module 266 that is characterized more closely for that temperature value. In this manner, the accuracy of the performance prediction may be improved over a range of temperatures. Model storage module 266 may be a read only memory that is loaded during manufacture of the chip, or it may be writable storage that is initialized each time the chip powered up, for example.

Referring again to FIG. 3, the count value that is loaded into each sensor register 372 to define the window of time over which counter 370 operates and the frequency goal value that is loaded into each goal register 373 may also be updated based on which performance prediction model is currently being used by sensor controller 264. These count and goal values may be determined during the characterization process as part of the linear regression process described above.

Figure 6:
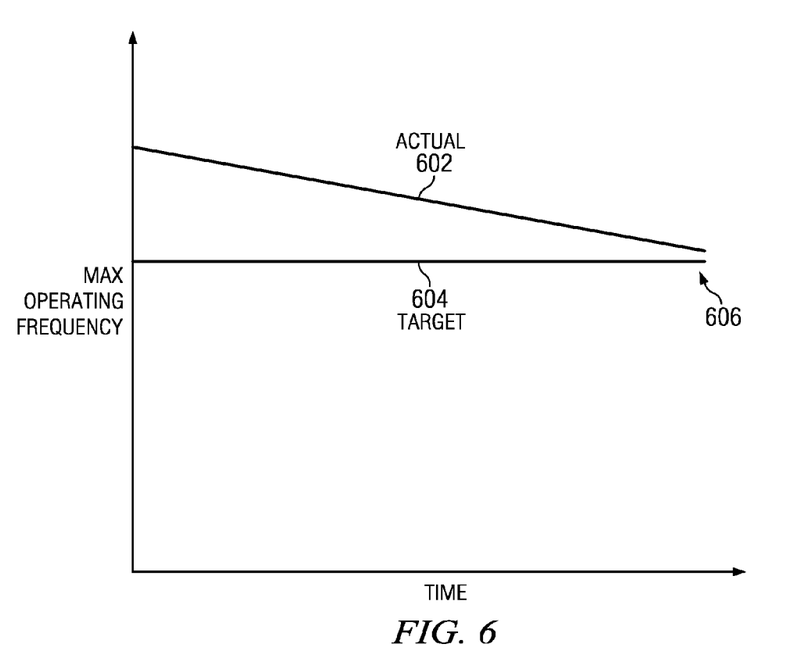
FIG. 6 is a plot illustrating erosion of performance over time.

FIG. 6 is a plot illustrating erosion of performance of SoC 101 over time. As part of the chip characterization process, accelerated life testing may be performed to determine a curve 602 that indicates performance over lifetime of the chip. An operating target value 604 for the performance prediction models should be selected such the target value 604 is below the actual value 602 at least until an end of life point 606.

A closed loop power monitor enables energy savings over time, since the voltage required to achieve a performance target may be smaller at the beginning of time and may increase as time elapses due to aging.

Figure 7:
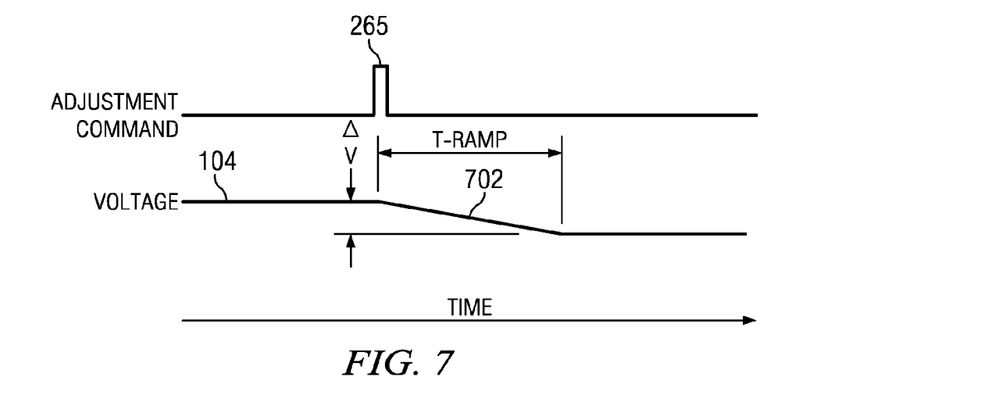
FIG. 7 is a timing diagram illustrating supply voltage ramping.

FIG. 7 is a timing diagram illustrating supply voltage ramping. When power management 160 determines that a performance threshold has been reached and the supply voltage therefore may be adjusted, it sends a voltage adjustment sequence 265 to the variable power supply, as described above. In response to the adjustment command, variable power supply 102 begins a slow ramp of supply voltage 104, as illustrated at 702. This plot illustrates a voltage decrease. A voltage increase is performed in a similar manner. The voltage ramp, ΔV/T-ramp, is controlled to minimize system disturbance. In this embodiment, the voltage ramp is limited to 25 millivolts/10 millisec. Other embodiments may limit the ramp to a higher or a lower rate and adjust T2 accordingly.

Figure 8:
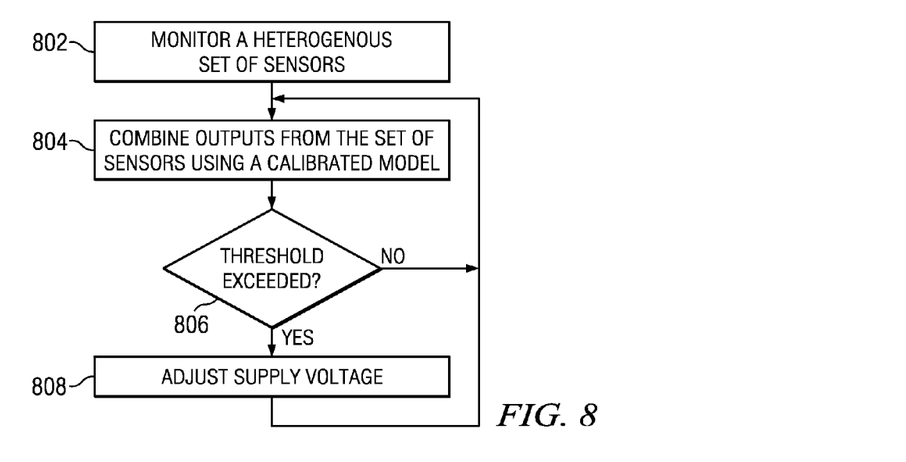
FIGS. 8 and 9 are a flow diagrams illustrating use of multiple heterogeneous sensors to control supply voltage in the system of FIG. 1.

FIG. 8 is a flow diagram illustrating use of multiple heterogeneous sensors to control supply voltage to and SoC in system 100. A heterogeneous set of performance prediction sensors are monitored 802 during operation of the system. As discussed above, the set of sensors may include various types of sensors that are sensitive different operating parameters such as voltage threshold, gate style, interconnect propagation delay, etc.

The output values of the set of sensors are combined using a calibrated voltage/temperature (V/T) model to determine when a threshold value is reached. One or more calibrated V/T models are developed during design and characterization of the SoC, as described in more detail above. These models may be stored in the SoC during manufacture, or may be downloaded to the SoC during initialization of the SoC each time the system is powered up, for example.

The combined output of the set of sensors is compared 806 to a threshold. This may be a single threshold value with a goal of remaining within a certain range of the threshold, or this may be a band defined by an upper threshold and a lower threshold. In either case, if the threshold value is exceeded 806, then a change 808 to an operating voltage is initiated for a portion of the integrated circuit in response to exceeding the threshold.

Monitoring 802 the set of sensors may include determining an operating frequency of each sensor, wherein the operating frequency of each sensor is indicative of a performance metric of the integrated circuit. The threshold value or threshold band is indicative of a target performance metric value. As discussed in more detail above, the output of the sensor are predictive of performance of the SoC based on temperature of the chip substrate.

Combing 804 the output values from the set of sensors may use a linear or a complex V/T model equation to weight the output values of each sensor, based on calibration of the V/T model equation that was done during design/characterization of the SoC.

Figure 9:
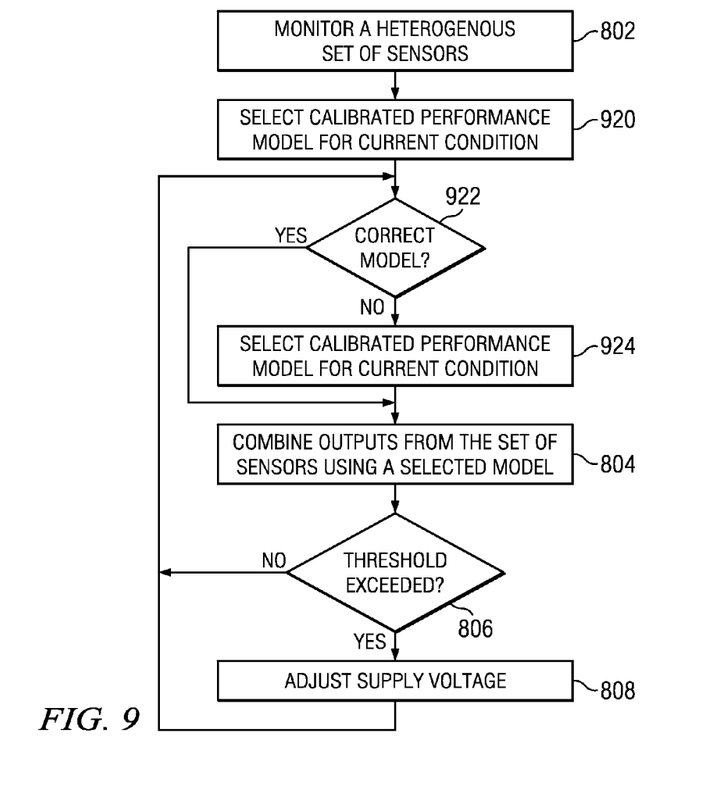

FIG. 9 is a flow diagram illustrating another embodiment of use of multiple heterogeneous sensors to control supply voltage to and SoC in system 100. In this embodiment, monitoring 802 a heterogeneous set of sensors, combining 804 the outputs values, and adjusting 808 a supply voltage for the SoC is performed in a similar manner as described with respect to FIG. 8. However, in this embodiment, a set of performance predictive V/T models are stored in the SoC that are optimized for various temperatures, as described in more detail above.

Initially, a performance model equation is selected 920 based on a current condition, such as temperature, of the SoC, as indicated by a temperature sensor, such as temperature sensor 265 in FIG. 2. For example, there may be one V/T model equation for low temperature operation and a second model equation for high temperature operation. Of course, there may be more than two model equation for finer grain optimization.

As operation of the SoC continues, the temperature may vary due to ambient temperature, application processing needs, etc. A check 922 is made periodically to determine if the performance model equation being used matches the current operation temperature. If not, another one of the performance model equations are selected 924 for use at the current temperature range.

In another embodiment, different performance models may be included that are selected based on other operating conditions in the SoC. For example, the SoC may include a number of processing modules. If an application is only using a subset of the processing modules, a performance model equation may be characterized to better model this operating condition.

Figure 10:
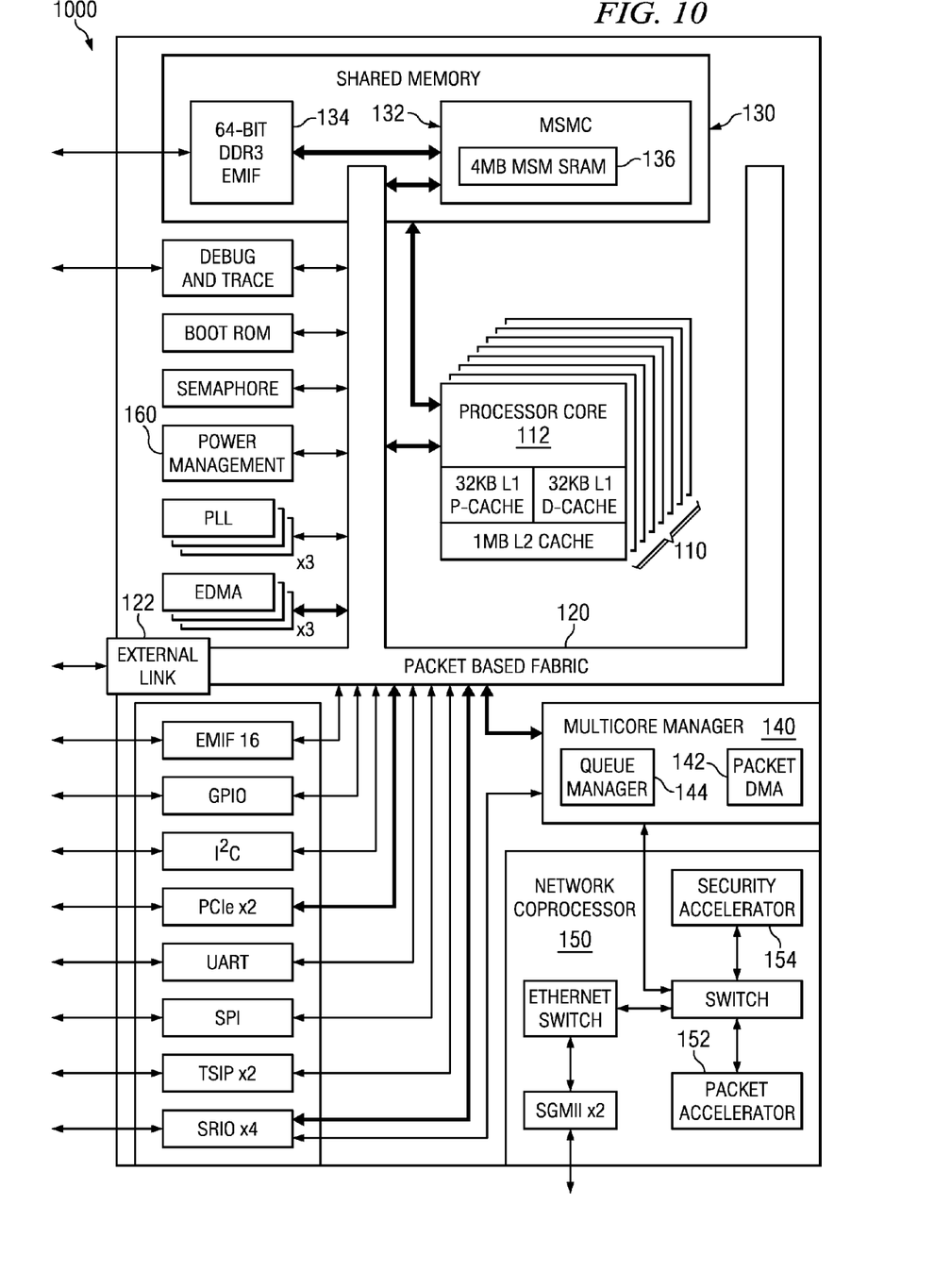
FIG. 10 is a functional block diagram of a system on chip (SoC) that includes an embodiment of the invention.

FIG. 10 is a functional block diagram of a system on chip (SoC) 1000 that includes an embodiment of the invention. System 1000 is a multi-core SoC that includes a set of processor modules 110 that each include a processor core, level one (L1) data and instruction caches, and a level two (L2) cache. In this embodiment, there are eight processor modules 110; however other embodiments may have fewer or greater number of processor modules. In this embodiment, each processor core is a digital signal processor (DSP); however, in other embodiments other types of processor cores may be used. A packet-based fabric 120 provides high-speed non-blocking channels that deliver as much as 2 terabits per second of on-chip throughput. Fabric 120 interconnects with memory subsystem 130 to provide an extensive two-layer memory structure in which data flows freely and effectively between processor modules 110, as will be described in more detail below. An example of SoC 100 is embodied in an SoC from Texas Instruments, and is described in more detail in "TMS320C6678—Multi-core Fixed and Floating-Point Signal Processor Data Manual", SPRS691, November 2010, which is incorporated by reference herein.

SoC 1000 includes power management logic 160 that includes multiple heterogeneous sensors that dynamically measure the frequency response of the chip to changes in temperature over time and attempts to control a supply voltage provided by a variable power supply in order to maintain a minimum required operating frequency while optimizing power consumption, as was described in more detail above. Sensors may be located in proximity to each of processor modules 110 and other heat producing co-processor and functional modules in order to provide accurate prediction of chip performance based on activity induced heating in each processor module.

External link 122 provides direct chip-to-chip connectivity for local devices, and is also integral to the internal processing architecture of SoC 100. External link 122 is a fast and efficient interface with low protocol overhead and high throughput, running at an aggregate speed of 50 Gbps (four lanes at 12.5 Gbps each). Working in conjunction with a routing manager 140, link 122 transparently dispatches tasks to other local devices where they are executed as if they were being processed on local resources.

There are three levels of memory in the SoC 100. Each processor module 110 has its own level-1 program (L1P) and level-1 data (L1D) memory. Additionally, each module 110 has a local level-2 unified memory (L2). Each of the local memories can be independently configured as memory-mapped SRAM (static random access memory), cache or a combination of the two.

In addition, SoC 1000 includes shared memory system 130, comprising internal and external memory connected through the multi-core shared memory controller (MSMC) 132. MSMC 132 allows processor modules 110 to dynamically share the internal and external memories for both program and data. The MSMC internal RAM 136 offers flexibility to programmers by allowing portions to be configured as shared level-2 RAM (SL2) or shared level-3 RAM (SL3). SL2 RAM is cacheable only within the local L1P and L1D caches, while SL3 is additionally cacheable in the local L2 caches.

External memory may be connected through the same memory controller 132 as the internal shared memory via external memory interface (EMIF) 134, rather than to chip system interconnect as has traditionally been done on embedded processor architectures, providing a fast path for software execution. In this embodiment, external memory may be treated as SL3 memory and therefore cacheable in L1 and L2.

SoC 1000 may also include several co-processing accelerators that offload processing tasks from the processor cores in processor modules 110, thereby enabling sustained high application processing rates. SoC 1000 may also contain an Ethernet media access controller (EMAC) network coprocessor block 150 that may include a packet accelerator 152 and a security accelerator 154 that work in tandem. The packet accelerator speeds the data flow throughout the core by transferring data to peripheral interfaces such as the Ethernet ports or Serial RapidIO (SRIO) without the involvement of any module 110's DSP processor. The security accelerator provides security processing for a number of popular encryption modes and algorithms, including IPSec, SCTP, SRTP, 3GPP, SSL/TLS and several others.

Multi-core manager 140 provides single-core simplicity to multi-core device SoC 100. Multi-core manager 140 provides hardware-assisted functional acceleration that utilizes a packet-based hardware subsystem. With an extensive series of more than 8,000 queues managed by queue manager 144 and a packet-aware DMA controller 142, it optimizes the packet-based communications of the on-chip cores by practically eliminating all copy operations.

The low latencies and zero interrupts ensured by multi-core manager 140, as well as its transparent operations, enable new and more effective programming models such as task dispatchers. Moreover, software development cycles may be shortened significantly by several features included in multi-core manager 140, such as dynamic software partitioning. Multi-core manager 140 provides "fire and forget" software tasking that may allow repetitive tasks to be defined only once, and thereafter be accessed automatically without additional coding efforts.

Two types of buses exist in SoC 1000 as part of packet based switch fabric 120: data buses and configuration buses. Some peripherals have both a data bus and a configuration bus interface, while others only have one type of interface. Furthermore, the bus interface width and speed varies from peripheral to peripheral. Configuration buses are mainly used to access the register space of a peripheral and the data buses are used mainly for data transfers. However, in some cases, the configuration bus is also used to transfer data. Similarly, the data bus can also be used to access the register space of a peripheral. For example, DDR3 memory controller 134 registers are accessed through their data bus interface.

Processor modules 110, the enhanced direct memory access (EDMA) traffic controllers, and the various system peripherals can be classified into two categories: masters and slaves. Masters are capable of initiating read and write transfers in the system and do not rely on the EDMA for their data transfers. Slaves on the other hand rely on the EDMA to perform transfers to and from them. Examples of masters include the EDMA traffic controllers, serial rapid I/O (SRIO), and Ethernet media access controller 150. Examples of slaves include the serial peripheral interface (SPI), universal asynchronous receiver/transmitter (UART), and inter-integrated circuit (I2C) interface.

Other Embodiments

Although the invention finds particular application to Digital Signal Processors (DSPs), implemented, for example, in a System on a Chip (SoC), it also finds application to other forms of processors. A SoC may contain one or more megacells or modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, is some embodiments there may be more than one voltage domain with a separate set of sensors, controller and variable power supply for each domain.

While ring oscillator sensors have been described herein for predicting chip performance, other types of sensors now known or later developed that provide a measure indicative of performance of an integrated circuit may be used to provide closed loop power management as described herein. For example, sensors that indicate a electron mobility, device threshold voltage, conductance of signal traces, While a multi-core SoC embodiment was described herein, other embodiments may use only a single core, for example. Another embodiment may be a control device or functional module that does not have an instruction processing unit, for example, but still implements power management and that may benefit by using a set of heterogeneous sensors to predict performance and thereby optimize power consumption.

While a DDR3 memory connected to an SoC was described herein, other embodiments may include other types of memory and peripheral subsystems coupled to an SoC that may also receive power from a variable power supply controlled by the SoC.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for scaling voltage in an integrated circuit, the method comprising:
monitoring at least two sensors on the integrated circuit, wherein each sensor provides an output value indicative of a performance metric of the integrated circuit, the monitoring including determining an operating frequency of each sensor, wherein the operating frequency of each sensor is indicative of a performance metric of the integrated circuit;
combining the output values from the at least two sensors using a performance model to determine when a threshold value is reached, wherein the threshold is indicative of a target performance metric value; and
initiating a change to an operating voltage for a portion of the integrated circuit in response to reaching the threshold.

2. The method of claim 1, wherein the output values of the sensors are temperature sensitive.

3. The method of claim 1, wherein one of the two sensors provides an output value that is indicative of interconnect propagation delay in the integrated circuit.

4. The method of claim 1, wherein one of the two sensors provides an output value that is indicative of threshold voltage of semiconductor devices in the integrated circuit.

5. A method for scaling voltage in an integrated circuit, the method comprising:
monitoring at least two sensors on the integrated circuit, wherein each sensor provides an output value indicative of a performance metric of the integrated circuit;
combining the output values from the at least two sensors using a performance model to determine when a threshold value is reached, wherein combing the output values from the at least two sensors comprises using a performance model with coefficients to weight the output values; and
initiating a change to an operating voltage for a portion of the integrated circuit in response to reaching the threshold.

6. A method for scaling voltage in an integrated circuit, the method comprising:
sensing an operating condition on the integrated circuit;
selecting a performance model from a plurality of performance models based on the current operating condition;
monitoring at least two sensors on the integrated circuit, wherein each sensor provides an output value indicative of a performance metric of the integrated circuit;

combining the output values from the at least two sensors using a performance model to determine when a threshold value is reached, wherein combining the output values uses the selected performance model; and initiating a change to an operating voltage for a portion of the integrated circuit in response to reaching the threshold.

7. The method of claim 6, wherein the operating condition is temperature of a region of a substrate of the integrated circuit.

8. The method of claim 6, wherein combining the output values from the at least two sensors comprises using a performance model with coefficients to weight the output values.

9. The method of claim 8, wherein the performance model is a complex equation.

10. A system comprising:
a processing module formed on an integrated circuit;
a plurality of performance sensors formed on the integrated circuit;
a storage module coupled to the power management module for storing a plurality of performance models;
a condition sensor coupled to the power management module for sensing an operating condition of the integrated circuit;
a power management controller coupled to the plurality of performance sensors, wherein the power management controller is configured combine output values from the plurality of performance sensors using a performance model to determine when a threshold value is reached for the integrated circuit and to initiate a change to a supply voltage for a portion of the integrated circuit in response to reaching the threshold, wherein the power management controller is configured to select a performance model based on a current operating condition.

11. The system of claim 10, wherein the operating condition is temperature of a region of a substrate of the integrated circuit.

12. The system of claim 10, wherein each performance model comprises coefficients to weight the output values.

13. The system of claim 12, wherein the performance model is a complex equation.

* * * * *